United States Patent
Lam et al.

(10) Patent No.: US 7,064,434 B2
(45) Date of Patent: Jun. 20, 2006

(54) CUSTOMIZED MICROELECTRONIC DEVICE AND METHOD FOR MAKING CUSTOMIZED ELECTRICAL INTERCONNECTIONS

(75) Inventors: Ken M. Lam, Colorado Springs, CO (US); Walter C. Bell, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 170 days.

(21) Appl. No.: 10/723,103

(22) Filed: Nov. 26, 2003

(65) Prior Publication Data

US 2005/0110139 A1    May 26, 2005

(51) Int. Cl.
*H01L 23/48* (2006.01)
*H01L 21/44* (2006.01)

(52) U.S. Cl. ...................... 257/738; 438/613
(58) Field of Classification Search ............... 257/737, 257/738, 778–781, 734, 741; 438/613, 614, 438/108, 650; 228/179.1, 180.1–180.22

See application file for complete search history.

(56) References Cited

U.S. PATENT DOCUMENTS

| | | | |
|---|---|---|---|
| 3,771,101 A | 11/1973 | Elkins | 339/17 C |
| 4,298,856 A | 11/1981 | Schuchardt | 338/195 |
| 5,359,227 A | 10/1994 | Liang et al. | 257/784 |
| 5,550,083 A | 8/1996 | Koide et al. | 437/183 |
| 6,169,331 B1 | 1/2001 | Manning et al. | 257/784 |
| 6,262,434 B1 | 7/2001 | Kalb | 257/48 |
| 6,500,760 B1 | 12/2002 | Peterson et al. | 438/684 |
| 6,583,483 B1 | 6/2003 | Masumoto et al. | 257/459 |
| 6,856,009 B1 * | 2/2005 | Bolken et al. | 257/686 |

* cited by examiner

*Primary Examiner*—Leonardo Andujar
(74) *Attorney, Agent, or Firm*—Schneck & Schneck; Thomas Schneck

(57) ABSTRACT

A method and apparatus electrically coupling input/output bond pads that are disposed proximate to one another on a microelectronic device. The apparatus includes a microelectronic device having at least two conductive input/output bond pads electrically coupled to an integrated circuit of the microelectronic device and first and second conductive stud balls bonded to first and second input/output pads, respectively, and a third conductive stud ball bonded to the first and second conductive stud balls. A wire bonding tool in "stud ball" mode is utilized to bond the conductive stud balls.

27 Claims, 4 Drawing Sheets

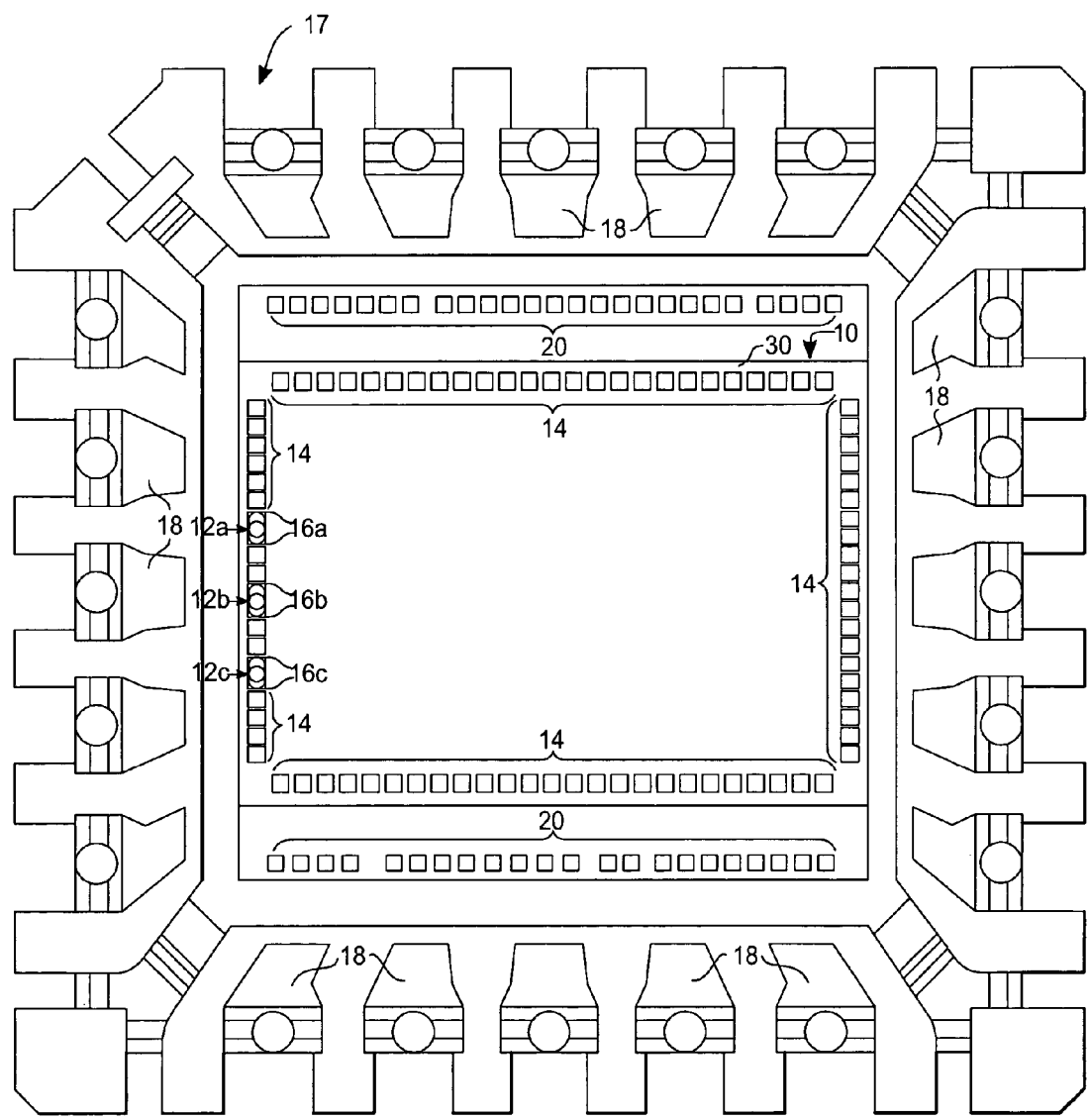
Fig._1

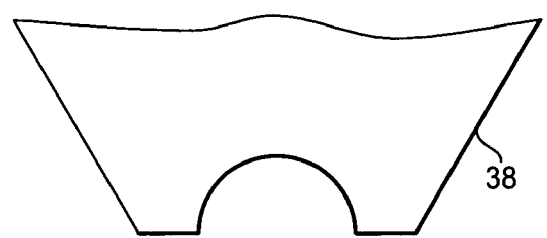
Fig._3
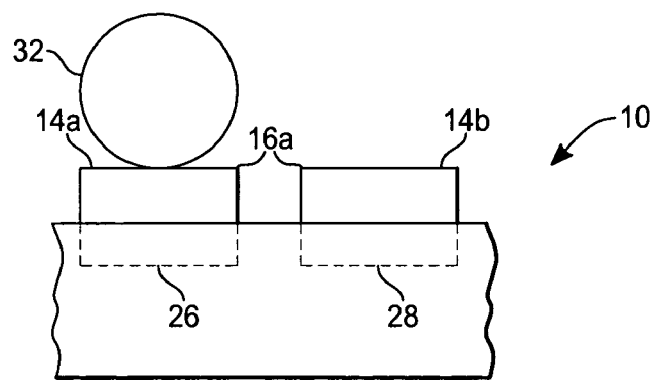
Fig._2a
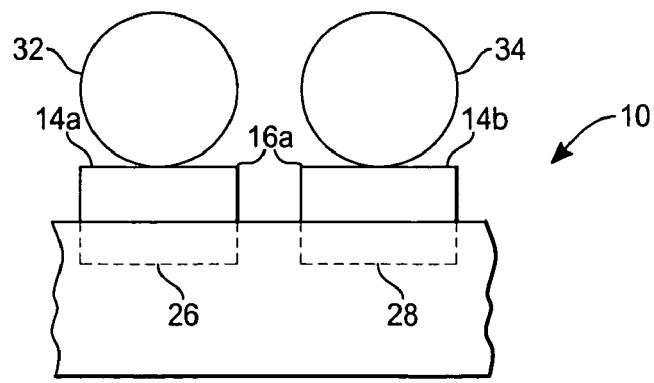
Fig._2B

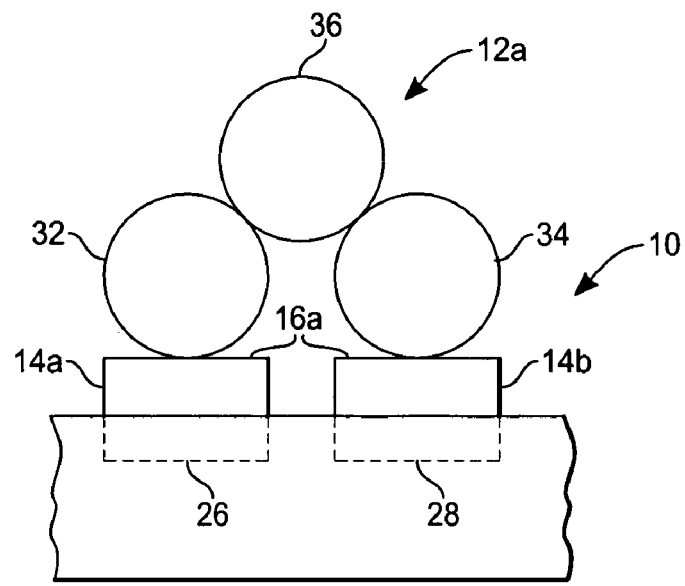
Fig. _2C
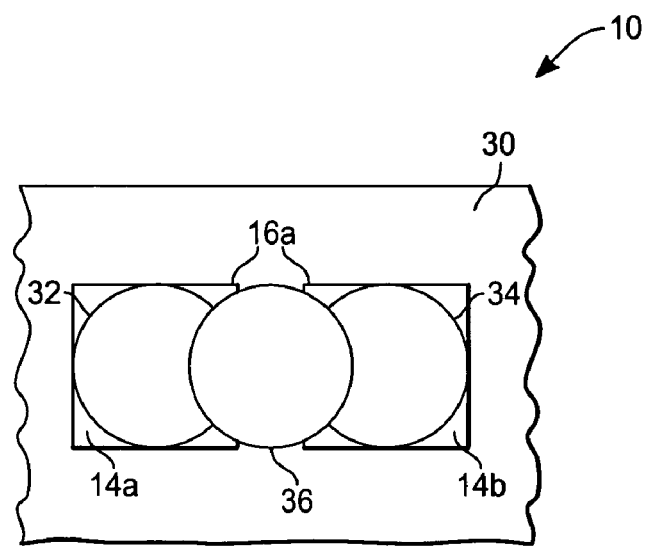
Fig. _2D

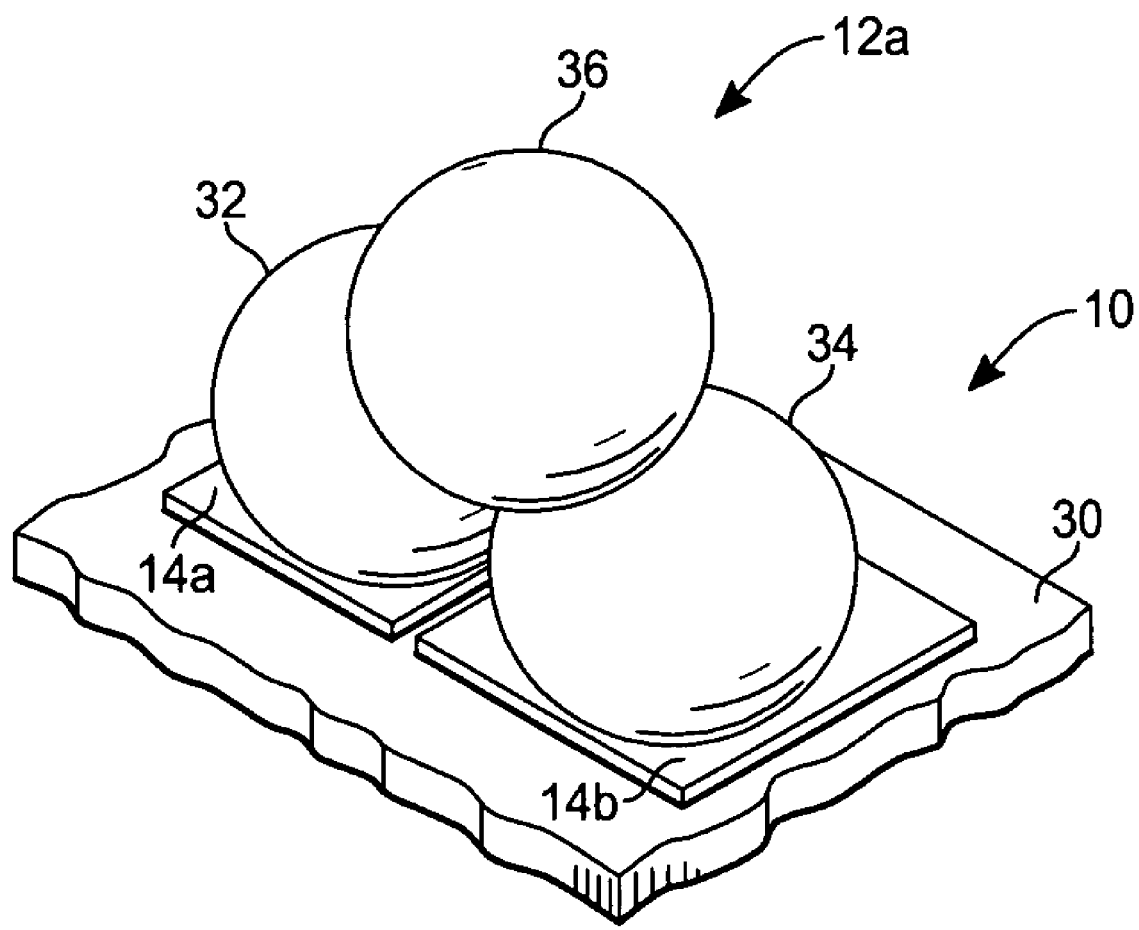
Fig._2E

CUSTOMIZED MICROELECTRONIC DEVICE AND METHOD FOR MAKING CUSTOMIZED ELECTRICAL INTERCONNECTIONS

TECHNICAL FIELD

The present invention relates to methods for electrically coupling and electrically coupled input/output bond pads of a microelectronic device.

BACKGROUND ART

Integrated circuit devices typically comprise a group of circuits, each of which is formed of interconnected elements fabricated on a semiconductor substrate. Certain circuits on an integrated circuit device are designed to be electrically separate so that they may be customized after the wafer-fabrication process. These integrated circuit devices can be customized by electrically connecting the separate circuits. Because gaps disposed between typical integrated circuits are relatively small, it can be difficult to make typical wire bond connections with a wire bonding tool known in the art. Typical wire bond connections include ball and wedge bonds having a ball and tail. The following patents illustrate different types of methods for electrically connecting separate circuits and apparatuses having electrical connections.

U.S. Pat. No. 4,298,856 to Schuchardt discloses establishing short circuit connections between different pairs of the bonding pads of a resistor by use of a simple glob of solder. Thus, the bonding pads must likely be solderable.

U.S. Pat. No. 6,262,434 to Kalb describes an integrated circuit including a first circuit structure, a first conductive bonding pad coupled to the first circuit structure, a second circuit structure, and a second conductive bonding pad coupled to the second circuit structure. The first conductive bonding pad is arranged to be separated from the second conductive bonding pad by a gap having a gap dimension. The gap dimension is configured to be bridged by a wire bond formed by a wire bonding tool, thereby electrically coupling the first conductive bonding pad to the second conductive bonding pad. It is possible to bridge the two bonding pads with a single bonding wire because the gap is bigger than that of the gap formed by a conventional semiconductor processing technique.

U.S. Pat. No. 6,169,331 to Manning et al. describes electronically coupling bond pads of a microelectronic device to each other. A first conductive member extends between the two bond pads and a second conductive member extends from one of the pads to a position external to the device. A combination of ball and wedge wire bonds, each having a ball and tail, is used to electrically connect the bond pads of the device. Where a conductive link already exists between the bond pads, the link between the two bond pads can be used to supplement the internal circuitry of the microelectronic device. Where a conductive link does not exist between the bond pads, the link between the two bond pads can be used to modify or repair the electronic device after it has been manufactured. The spacing between the bond pads of one device and the bond pads of another device may be large enough to allow for typical wire bonds.

It is an object of the present invention to provide a method for electrically connecting input/output bond pads of a microelectronic device.

It is another object of the present invention to provide an apparatus having electrically connected input/output bond pads on a microelectronic device.

It is another object of the present invention to provide a method for customizing an integrated circuit device.

SUMMARY OF THE INVENTION

The above and other objects have been achieved by a method including bonding first and second conductive stud balls to respective first and second conductive input/output bond pads of a microelectronic device and bonding a third conductive stud ball to the first and second conductive stud balls with a wire bonding tool in a "stud ball" mode or other tool capable of bonding stud balls. A wire bonding tool in stud ball mode bonds only a stud ball to the desired surface, instead of both a ball and tail. The stud ball bonding may occur at the packaging assembly level and is easily integrated into the standard automatic wire bonding process.

The microelectronic device of the present invention includes a semiconductor substrate having an integrated circuit with circuitry electrically connected to conductive input/output bond pads. Each input/output bond pad of at least one pair of the input/output pads has a bonded conductive stud ball. An additional third conductive stud ball is bonded to the stud balls on the bond pad pairs. The input/output bond pads are disposed proximate to one another and may be separated by a standard distance utilized in the art. In one example, the conductive stud ball is a gold stud ball and the input/output bond pads are aluminum.

A user may customize the integrated circuit by selecting, from a plurality of input/output bond pads, a particular pair of input/output bond pads on a microelectronic device corresponding to circuitry to be electrically connected.

BRIEF DESCRIPTION OF THE DRAWINGS

FIG. 1 is a diagram of an integrated circuit chip and associated leads and pins.

FIG. 2A is a partial side view of the integrated circuit chip of FIG. 1 having a first stud ball bonded to a first input/output bond pad.

FIG. 2B is a partial side view of the integrated circuit chip of FIG. 2A having a second stud ball bonded to a second input/output bond pad.

FIG. 2C is a partial side view of the integrated circuit chip of FIG. 2B having a third stud ball bonded to the first and second stud balls.

FIG. 2D is a partial top view of the integrated circuit chip of FIG. 2C.

FIG. 2E is a partial perspective view of the integrated circuit chip of FIG. 2D.

FIG. 3 is a partial side view of a wire bonding tool.

DETAILED DESCRIPTION OF THE INVENTION

With reference to FIG. 1, stud ball bond arrangement 12 of the present invention is seen. An integrated circuit device such as integrated circuit chip 10, including a plurality of input/output bond pads 14, has for example, three stud ball bond arrangements 12 of the present invention. In the example shown in FIG. 1, three pairs 16a, 16b, and 16c of conductive input/output bond pads 14 disposed on a surface 30 of the integrated circuit chip 10 are electrically connected by the stud ball bond arrangements 12a, 12b, and 12c of the present invention. Any desired number of pairs 16 of input/output bond pads may be electrically connected with a corresponding number of stud ball bond arrangements 12 of the present invention. If desired, the stud ball bond arrangement 12 of the present invention may be formed post wafer fabrication and at stages before or after package level assembly. When conductive stud balls are bonded in accord with the present invention, select input/output bond pads and the circuitry connected to the select input/output bond pads are electrically connected.

The integrated circuit chip 10 is mounted on a substrate, such as a chip carrier 17. The chip carrier 17 includes leads 18 and pins 20 which are typically electrically connected to input/output bond pads 14 of the plurality of input/output bond pads of the integrated circuit chip. Electrical connections to the leads 18 and pins 20 may occur at the package assembly level, though such electrical connections are not shown here.

Referring to FIGS. 2A–2E and FIG. 3, a method of forming the stud ball arrangement 12a with regard to bond pair 16a is shown. This method is applicable when forming additional stud ball arrangements 12 for other bond pairs 16 of an integrated circuit chip. A first input/output bond pad 14a is spaced apart from and proximate to a second input/output bond pad 14b to which it is paired. On a standard integrated circuit chip, the input/output bond pads are typically spaced about 60–65 microns apart, however, other spacing may be used in conjunction with the present invention. In one example, the input/output bond pads 14a and 14b have dimensions of 80 microns by 80 microns. The input/output bond pads 14a and 14b are in electrical communication with circuitry, for example circuits 26 and 28, represented with the illustrated perforations, of integrated circuit chip 10.

In each select input/output bond pad pair 16a, a first conductive stud ball 32 is bonded to the first input/output bond pad 14a, a second conductive stud ball 34 is bonded to the second input/output bond pad 14b, and a third conductive stud ball 36 is bonded to both first and second conductive stud balls 32 and 34, forming the stud ball arrangement 12a. The stud balls desirably comprise a metal that can be formed into a fine wire for the standard ball bonding process. The metal used to form the stud balls should form a reliable bond with the integrated circuit chip's input/output bond pad. For example, gold alloys reliably bond with aluminum metal input/output bond pads on a typical integrated circuit chip, and thus may be used to form stud balls. Also, copper wire for standard ball bonding can be used to form the stud balls. Copper reliably bonds to copper input/output bond pads. In one example, the stud balls 32, 34, and 36 are gold and the input/output bond pads 14a and 14b are aluminum. In another example, the stud balls 32, 34, and 36 are copper and the input/output bond pads 14a and 14b are copper.

Stud balls are typically twice the diameter of the bond wire. In one example, the bond wire diameter is 1 mil and the stud ball has a diameter of 2 mils. In one example, the thickness of the stud ball is approximately 1.5 mils.

Referring back to FIG. 1, the input/output bond pads 14 provide means by which electrical signals are input or output from the underlying connected circuitry of the integrated circuit chip 10 to enable the operation of the underlying circuits. In one example, one input/output bond pad of the bond pad pair is utilized to input or output a int_osc_en_vdd signal utilized for internal oscillator enable power where the other input/output bond pad of the same bond pair is utilized to input or output a int_osc_en signal utilized for internal oscillator enable. Therefore, when the input/output bond pair 16 is connected with the stud ball bond arrangement 12, electrical connecting of the circuitry associated with these signals occurs.

Other examples of input/output bond pad pairs on an integrated circuit electrically connected by means of the stud ball bond arrangement of the present invention are bond pad pairs utilized for the input or output of the following signals:
int_osc_en and int_osc_en_vss for connecting the internal oscillator enable to ground;
den_cs0 and den_cs0_vss for connecting the density chip select 0 to ground; and
den_cs1 and den_cs1_vss for connecting the density chip select 1 to ground.

With reference to FIG. 3, a wire bonding tool 38, known in the art, is seen. In one example, the wire bonding tool utilized in the present invention is a K&S 8020 wire bonding tool. Other wire bonding tools and other tools capable of bonding stud balls may be utilized in the present invention. The wire bonding tool may be a type that bonds a stud ball to the select location using thermo-sonic, ultrasonic, or compression bonds. The resulting stud ball size and shape is determined by the bonding tool and the bonding tool settings. The bonding tool parameters and related equipment parameters affect the geometry of the stud ball. The stud ball need not be spherical and may take the shape of a bump, for example.

With reference to FIGS. 2A and 3, the wire bonding tool 38 is programmed to be or placed in stud ball bonding mode and the first conductive stud ball 32 is bonded to conductive input/output bond pad 14a of the integrated circuit device 10 with the wire bonding tool 38.

With reference to FIGS. 2B and 3, the wire bonding tool 38 in stud ball bonding mode is used to bond a second conductive stud ball 34 to the conductive input/output bond pad 14b spaced apart from and disposed proximate to the input/output bond pad 14a.

With reference to FIGS. 2C, 2D and 3, the wire bonding tool 38 in stud ball bonding mode is used to bond a third conductive stud ball 36 to the first and second conductive stud balls 32 and 34, electrically connecting the underlying circuits. With the stud ball bond arrangement 12 of the present invention, the underlying circuits, in one example circuits 26 and 28, are electrically connected customizing the integrated circuit chip.

After the desired number of stud ball bonding arrangements 12 of the present invention have been bonded to select input/output bond pad pairs, the wire bonding tool may be programmed to be or placed in a standard bonding mode to wedge or ball bond together desired structures with a typical ball and tail structure. In the standard bonding mode, the integrated circuit device may be electrically connected to the device carrier.

The present invention allows a user to select which circuits of an integrated circuit device he desires to electrically connect through select input/output bond pad pairs corresponding to the circuits to be electrically connected by means the stud ball bond arrangement of the present invention.

What we claim is:

1. A microelectronic device comprising:
an integrated circuit device having first and second conductive bond pads disposed on a surface of said integrated circuit device, said first conductive bond pad being spaced apart from and proximate to said second conductive bond pad, said first and second conductive bond pads being both in electrical connection with said integrated circuit device; and
a first conductive stud ball bonded to said first conductive bond pad, a second conductive stud ball bonded to said second conductive bond pad, and a third conductive stud ball bonded to said first and second conductive stud balls, said third conductive stud ball electrically connecting said first and second conductive bond pads.

2. The microelectronic device of claim 1 wherein said first and second conductive bond pads are separated by a distance of about 60 microns.

3. The microelectronic device of claim 1 wherein each of said bond pads has dimensions of about 80 microns by 80 microns.

4. The microelectronic device of claim 1 wherein said conductive bond pads are aluminum.

5. The microelectronic device of claim 1 wherein said conductive stud balls are gold.

6. The microelectronic device of claim 1 wherein said conductive bond pads are copper.

7. The microelectronic device of claim 1 wherein said conductive stud balls are copper.

8. The microelectronic device of claim 1 wherein said conductive stud balls are gold and said conductive bond pads are gold.

9. The microelectronic device of claim 1 wherein said conductive stud balls are copper and said conductive bond pads are copper.

10. The microelectronic device of claim 1 wherein said conductive stud ball has a diameter of 2 mils and a thickness of approximately 1.5 mils.

11. The microelectronic device of claim 1 further comprising a substrate upon which said microelectronic device is mounted.

12. A method of forming an electrical connection between first and second proximate conductive bond pads disposed on and electrically coupled to an integrated circuit device having circuits, comprising:
   bonding a first conductive stud ball to said first conductive bond pad;
   bonding a second conductive stud ball to said second conductive bond pad; and
   electrically connecting said first and second conductive bond pads by bonding a third conductive stud ball to said first and second conductive stud balls.

13. The method according to claim 12 wherein bonding said first and second conductive stud balls to said first and second conductive bond pads includes utilizing a wire bonding tool in a stud ball bonding mode.

14. The method according to claim 13 further comprising placing said wire bonding tool in a stud ball bonding mode before bonding said first, second and third conductive stud balls and placing said wire bonding tool in a standard bonding mode after bonding said first, second and third conductive stud balls.

15. The method according to claim 12 further comprising thermo-sonically bonding said first, second and third conductive stud balls.

16. The method according to claim 12 further comprising ultrasonically bonding said first, second and third conductive stud balls.

17. The method according to claim 12 further comprising compression bonding said first, second and third conductive stud balls.

18. The method according to claim 12 further comprising electrically connecting said integrated circuit structure to a substrate with a wire bonding tool in a standard bonding mode.

19. The method according to claim 12 wherein said first, second, and third conductive stud balls are gold.

20. The method according to claim 12 wherein said first and second conductive bond pads are aluminum.

21. The method according to claim 12 further comprising selecting said first and second conductive bond pads from a plurality of bond pads disposed on said integrated circuit device.

22. A microelectronic device assembly comprising:
   a microelectronic device having a first circuit structure, a first conductive bonding pad electrically coupled to the first circuit structure, a second circuit structure, and a second conductive bonding pad electrically coupled to the second circuit structure;
   a first conductive stud ball bonded to said first conductive bonding pad;
   a second conductive stud ball bonded to said second conductive bonding pad;
   a third conductive stud ball bonded to said first and second conductive stud balls; and
   a substrate electrically connected to said microelectronic device.

23. The microelectronic device assembly of claim 22 wherein said conductive stud balls are gold.

24. The microelectronic device assembly of claim 22 wherein said conductive bonding pads are aluminum.

25. The microelectronic device assembly of claim 22 wherein said conductive bonding pads are proximate to one another.

26. The microelectronic device assembly of claim 22 wherein said third conductive stud ball is disposed in between said first and second conductive stud balls.

27. The microelectronic device assembly of claim 22 wherein said microelectronic device is an integrated circuit chip.

* * * * *